(12) United States Patent
Meneghini

(10) Patent No.: US 8,790,464 B2
(45) Date of Patent: Jul. 29, 2014

(54) CONTROL FOR AND METHOD OF PULSED GAS DELIVERY

(75) Inventor: Paul Meneghini, Ipswich, MA (US)

(73) Assignee: MKS Instruments, Inc., Andover, MA (US)

( * ) Notice: Subject to any disclaimer, the term of this patent is extended or adjusted under 35 U.S.C. 154(b) by 976 days.

(21) Appl. No.: 12/689,961

(22) Filed: Jan. 19, 2010

(65) Prior Publication Data

US 2011/0174219 A1 Jul. 21, 2011

(51) Int. Cl.
*C23C 16/455* (2006.01)
*C23C 16/52* (2006.01)
*F16K 31/00* (2006.01)
*F17D 3/00* (2006.01)

(52) U.S. Cl.
USPC ........... 118/715; 118/679; 118/684; 118/692; 118/696; 118/699; 156/345.24; 156/345.26; 156/345.29; 137/624.11

(58) Field of Classification Search
USPC ................. 118/679, 684, 692, 696, 699, 715; 156/345.24, 345.26, 345.29; 137/624.11
See application file for complete search history.

(56) References Cited

U.S. PATENT DOCUMENTS

| | | | |
|---|---|---|---|
| 5,742,523 A | 4/1998 | Thomas et al. | |
| 6,887,521 B2 | 5/2005 | Basceri | |
| 6,913,031 B2 | 7/2005 | Nawata et al. | |
| 6,949,202 B1 * | 9/2005 | Patel et al. | 216/58 |
| 7,615,120 B2 * | 11/2009 | Shajii et al. | 118/666 |
| 7,628,860 B2 * | 12/2009 | Shajii et al. | 118/666 |
| 7,628,861 B2 * | 12/2009 | Clark | 118/666 |
| 2005/0223979 A1 * | 10/2005 | Shajii et al. | 118/692 |
| 2006/0060139 A1 * | 3/2006 | Meneghini et al. | 118/715 |
| 2006/0130755 A1 | 6/2006 | Clark | |
| 2006/0207503 A1 * | 9/2006 | Meneghini et al. | 118/715 |
| 2007/0022951 A1 * | 2/2007 | Spartz | 118/715 |
| 2007/0026540 A1 * | 2/2007 | Nooten et al. | 438/5 |
| 2007/0039549 A1 * | 2/2007 | Shajii et al. | 118/715 |
| 2007/0039550 A1 * | 2/2007 | Shajii et al. | 118/715 |
| 2007/0119814 A1 * | 5/2007 | Patel et al. | 216/59 |
| 2011/0174219 A1 * | 7/2011 | Meneghini | 118/699 |

FOREIGN PATENT DOCUMENTS

| | | |
|---|---|---|
| EP | 0660091 | 6/1995 |
| JP | 05-127755 | 5/1993 |
| JP | 07-217485 | 8/1995 |

OTHER PUBLICATIONS

International Search Report and the Written Opinion from corresponding PCT Application No. PCT/US2011/020324.
English Version of Search Report dated Jun. 11, 2013 from Corresponding Taiwan Patent Application Number: 100101705.
English Version of Office Action dated Oct. 17, 2013 from Corresponding Japanese Patent Application No. 2012-550022.

* cited by examiner

Primary Examiner — Jeffrie R Lund
(74) Attorney, Agent, or Firm — McDermott Will & Emery LLP

(57) ABSTRACT

A mole delivery system and method provide pulses of known molar quantities as a function of the time duration of each pulse, which in turn is derived as a function of the ideal gas law. In one embodiment of the system, the system comprises: a chamber of known volume and controlled and known temperature; a pressure sensor to measure the pressure in the chamber; an outlet valve to a process tool; an inlet valve to charge the chamber with the delivery gas; and a control system configured and arranged so as to control the operation of the outlet valve, control the amount of each gas pulse by controlling the timing of the valve to the process tool.

26 Claims, 9 Drawing Sheets

| | | Moles | | | | | | |
|---|---|---|---|---|---|---|---|---|
| | n1 | n2 | n3 | n4 | n5 | n6 | ... | nM |
| P1 | t11 | t12 | t13 | t14 | t15 | t16 | ... | t1M |
| P2 | t21 | t22 | t23 | t24 | t25 | t26 | ... | t2M |
| P3 | t31 | t32 | t33 | t34 | t35 | t36 | ... | t3M |
| P4 | t41 | t42 | t43 | t44 | t45 | t46 | ... | t4M |
| P5 | t51 | t52 | t53 | t54 | t55 | t56 | ... | t5M |
| ... | ... | ... | ... | ... | ... | ... | ... | ... |
| PN | tN1 | tN2 | tN3 | tN4 | tN5 | tN6 | ... | tNM |

Initial Pressure

400

Outlet Valve Time Control Table

Fig. 4

CONTROL FOR AND METHOD OF PULSED GAS DELIVERY

FIELD

The present disclosure generally relates to the measurement and control of delivering small, precise amounts of a gas or vapor, and more specifically to a calibrated control system for and method of accurately delivering metered pulses of gases or vapors so as to control the exact molar quantity of a gas or vapor delivered in each pulse.

BACKGROUND

As mentioned herein, everywhere where the context so permits, the reference to a "gas" or "gases" respectively includes "vapor" or "vapors" The fabrication of semiconductor devices often requires the careful synchronization and precisely measured delivery of as many as a dozen or more gases to a process tool, such as a process chamber or reactor. Various recipes are used in the manufacturing process, and many discrete processing steps can be required. For example, a semiconductor device may be required to be cleaned, polished, oxidized, masked, etched, doped, metalized, etc. The steps used, their particular sequence, and the materials involved all contribute to the making of a particular device.

As device sizes continue to shrink below 90 nm, the semiconductor roadmap suggests that atomic layer deposition (ALD) processes will be required for a variety of applications, such as the deposition of barriers for copper interconnects, the creation of tungsten nucleation layers, and the production of highly conducting dielectrics to name just a few. In the ALD process, two or more precursor gases sequentially flow over a wafer surface in a process chamber maintained under vacuum. The two or more precursor gases usually are introduced in a series of successive pulses into one or more reactors, so that the gases can react with the sites or functional groups on the wafer surface. The pulses need to be carefully controlled so that the number of moles of a gas delivered is precise. In fact, with an ALD process the control usually needs to be so precise as to control the number of atoms or molecules of a gas delivered in each pulse. See, for example, U.S. Pat. Nos. 7,615,120 (Shajii et al.); 6,913,031 (Nowata et al.) and 6,887,521 (Basceri); and US Patent Application Publication Nos. 2007/0022951 (Spartz) and 2006/0130755 (Clark). When all of the available sites are saturated with one of the precursor gases (e.g., gas A), the reaction stops and a purge gas is typically used to purge the excess precursor molecules from the process chamber. The process is typically repeated, as the next precursor gas (e.g., gas B) flows over the wafer surface. A typical cycle for a simple process using only two precursor gases is defined, for example, as one pulse of precursor gas A, purge, one pulse of precursor gas B, and purge. This sequence is usually repeated until the final thickness is reached. Each of these cycles of self-limiting surface reaction with precursor gases results in one mono-atomic layer of deposited film per cycle.

The pulses of precursor gases introduced to a tool, such as a processing chamber or reactor are normally controlled using on/off-type or shut-off valves. One valve is used as an inlet valve to the reservoir to be charged, while a second is used as an outlet valve from the reservoir to control the pulse delivered to a tool. The outlet valve is simply opened for a predetermined period of time necessary to deliver desired molar amount of precursor gas from the storage reservoir. One current method of controlling the flow of pulses, exemplified in the disclosure of U.S. Pat. No. 7,615,120 (Shajii et al.), includes a technique of controlling the timing of the opening and closing of the appropriate inlet valve for charging a storage reservoir. The number of moles delivered is based on the pressure drop in the storage reservoir of known volume upstream of the outlet valve and a real time gas temperature model to address temperature fluctuations of the gas in the storage reservoir volume due to transitions from valve operations, i.e., opening and closing of the inlet and outlet valves used to control the flow of gas or vapor into and out of the reservoir. This approach requires prior knowledge of the gas since it is dependent on the properties of the gas flowing through the system.

SUMMARY

What is still desired is a new and improved system for and method of rapidly and repeatedly delivering, as a pulse of gas, a predictable and repeatable amount of precursor gas to a tool, such as a processing chamber or reactor, by controlling the time duration of each pulse independent of the gas to be delivered.

In one embodiment, by ensuring that the volume of the upstream reservoir remains constant, and the gas delivered by the system is always at a uniform temperature at the beginning and end of each pulse, a table of values of the time intervals of pulses can be created dependent solely on the molar amounts of gas to be delivered and the starting pressure within the storage reservoir. The permissible range of pressures at which the gas can be maintained in the reservoir and predictably delivered is dictated by the gas, but only to ensure that the gas remains in satisfactory condition throughout the range for the process to be performed by the tool. Once the table is established with sufficient data, the system can then deliver a precise molar quantity of a gas with each pulse even though the starting pressure of the gas in the chamber, prior to the delivery of a pulse, may vary over the permissible range. The system thus controls the number of atoms or molecules of the gas provided by each pulse solely as a function of the time duration of the pulse, which is determined as a function of the starting pressure in the upstream chamber. The improved system and method is particularly useful, for example, in semiconductor manufacturing processes, such as ALD processes.

Furthermore, other advantages and aspects of the improved system for and method of measuring and delivering a pulsed flow of each precursor gas can be used to predict and detect some, if not all modes of valve failure of the valve used to deliver each pulse.

Other features and advantages of the present disclosure will be understood upon reading and understanding the detailed description of exemplary embodiments, described herein, in conjunction with reference to the drawings.

BRIEF DESCRIPTION OF THE DRAWINGS

Aspects of the present disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 4 is a diagram showing an exemplary lookup table for the exemplary system of FIG. 1;

Figure 1:
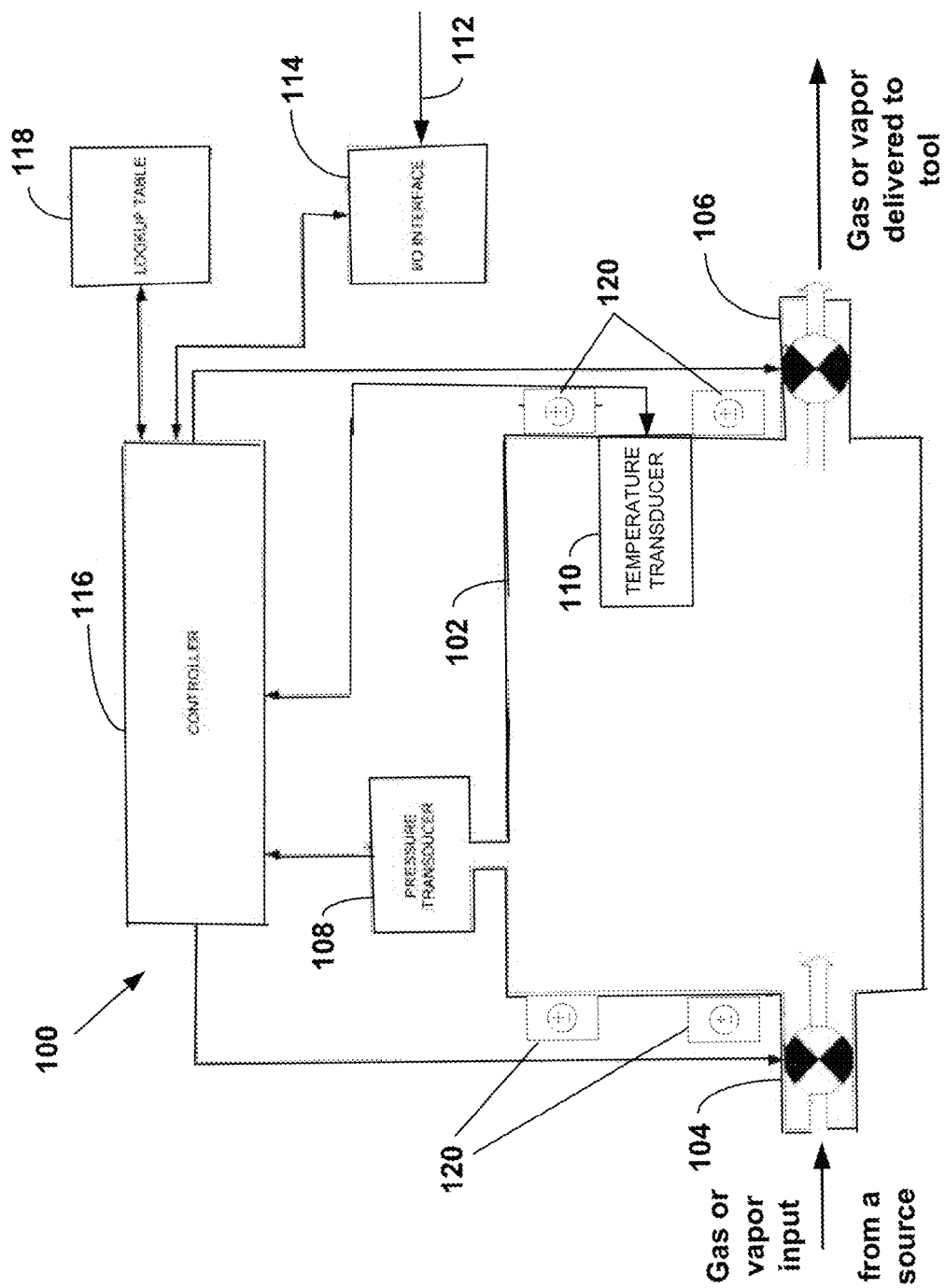
FIG. 1 is a block diagram of an exemplary embodiment of a pulsed gas delivery system configured to deliver pulses of gas, each containing a prescribed or predicted molar quantity of the gas as a function of the time duration of each pulse and the starting pressure of the gas in an upstream chamber.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

As described previously, embodiments of the present disclosure are directed to a system for and method of accurately and repeatedly delivering precise molar amounts of gas as pulses to a tool from a chamber or reservoir of fixed volume at a fixed temperature as a function of the time interval of each of the pulses delivered from the chamber and the starting pressure of the gas in the reservoir. A lookup table can be created containing data representing various values of the time interval of each pulse as a function of the molar quantity delivered, and the starting pressure of the gas in the reservoir prior to the initiation of each pulse. The data in the look up table can be generated as a function of the starting and ending pressure of the gas before and after each pulse interval. The time interval of the pulse is controlled by a valve used to control the flow of gas from the chamber. This is possible because the volume of the chamber is fixed. The temperature of the gas or vapor in the upstream gas chamber can be measured and should be maintained at a constant value, i.e., should be at the same value prior to initiating the pulse and following the delivery of the pulse. If the chamber volume and temperature are the same prior to and after the delivery of a pulse of gas, the ideal gas law provides that the number of moles delivered during a pulse interval will then be a function of a single variable, i.e., the difference between the starting and ending pressure of the gas within the chamber prior to and following the delivery of the pulse. As a result, the time interval of each pulse can be determined in order to deliver a known molar quantity of gas to the tool given knowledge of a starting pressure. It should be noted that the starting pressure and ending pressure before and after the pulse is delivered should be stable in order for the temperature of the gas to remain constant. At the end of the time interval the final pressure in the chamber will change to a predictable value based on the ideal gas law. Once the data is created, the final pressure need not be measured in order to determine a predetermined molar quantity of gas delivered in a carefully controlled time control pulse if the starting pressure is known.

The correlation between the molar quantity to be delivered by a pulse of gas and the time interval of the pulse at an initial or starting pressure can by determine in situ. The correlated data can then be generated and stored in a readable lookup.

Figure 2:
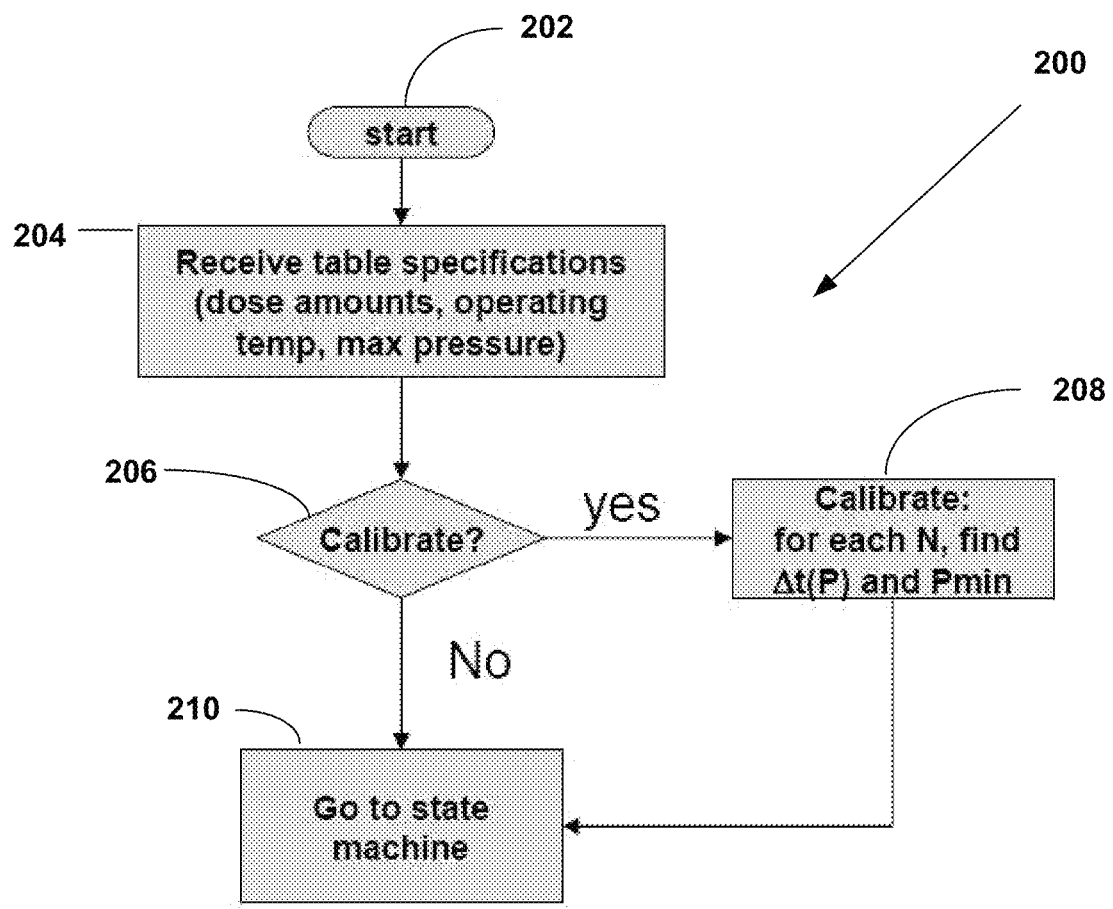
FIG. 2 is a flow chart illustrating an exemplary embodiment of a method of calibrating the system of FIG. 1.
Figure 3:
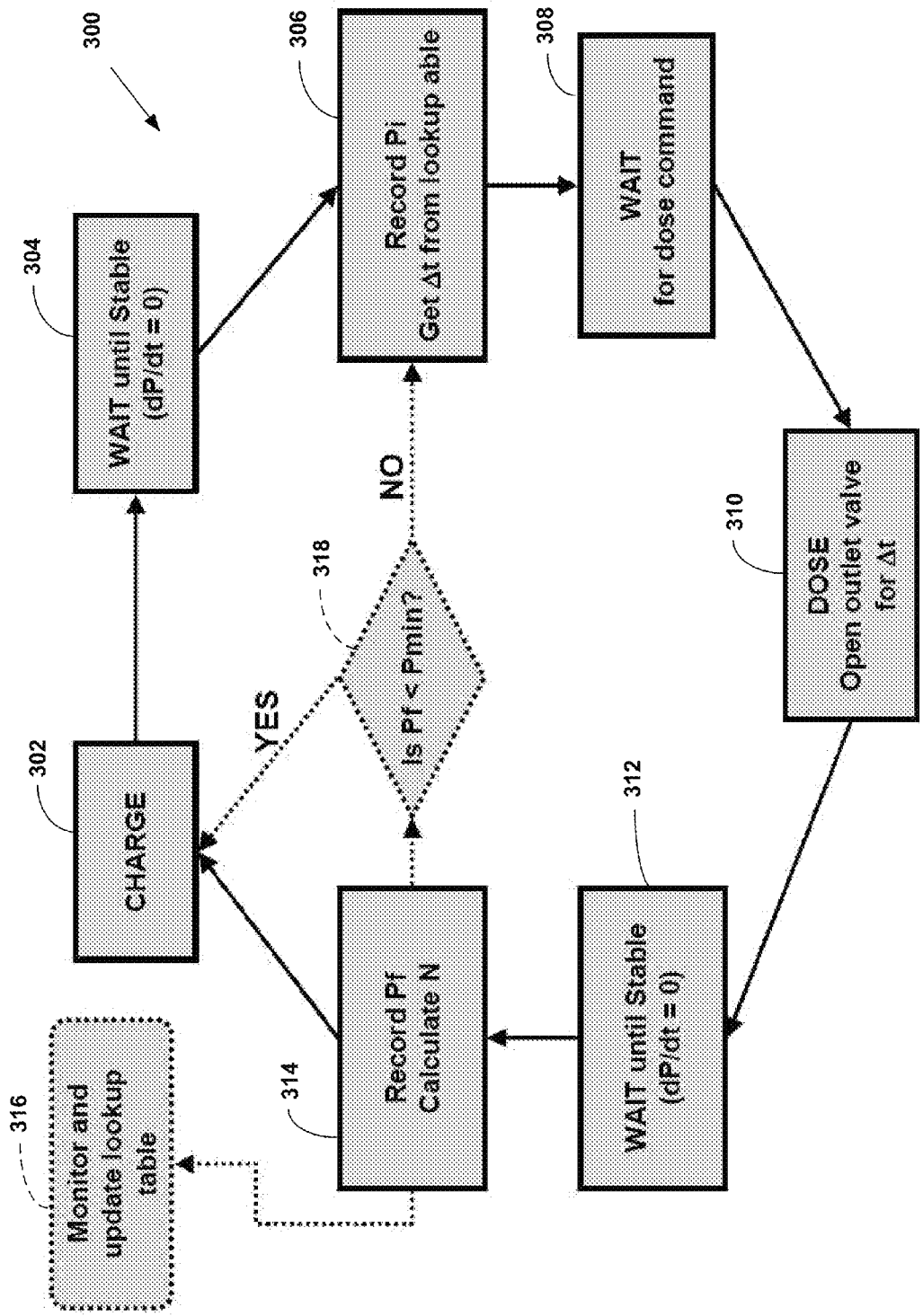
FIG. 3 is a state diagram illustrating an exemplary embodiment of a method of operating the system of FIG. 1 for delivering precise molar quantities of a gas or vapor.
Figure 5A:
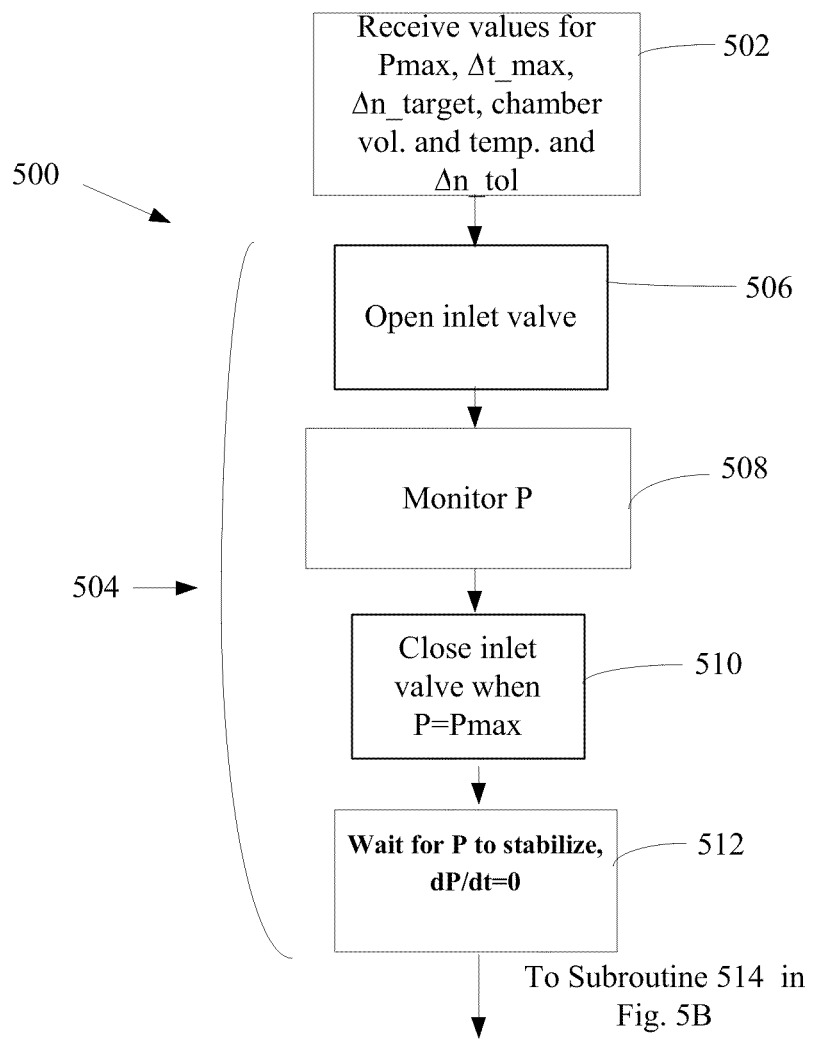
FIGS. 5A-5D illustrate a flow chart of one embodiment of a procedure for populating the lookup table with the required data.
Figure 5B:
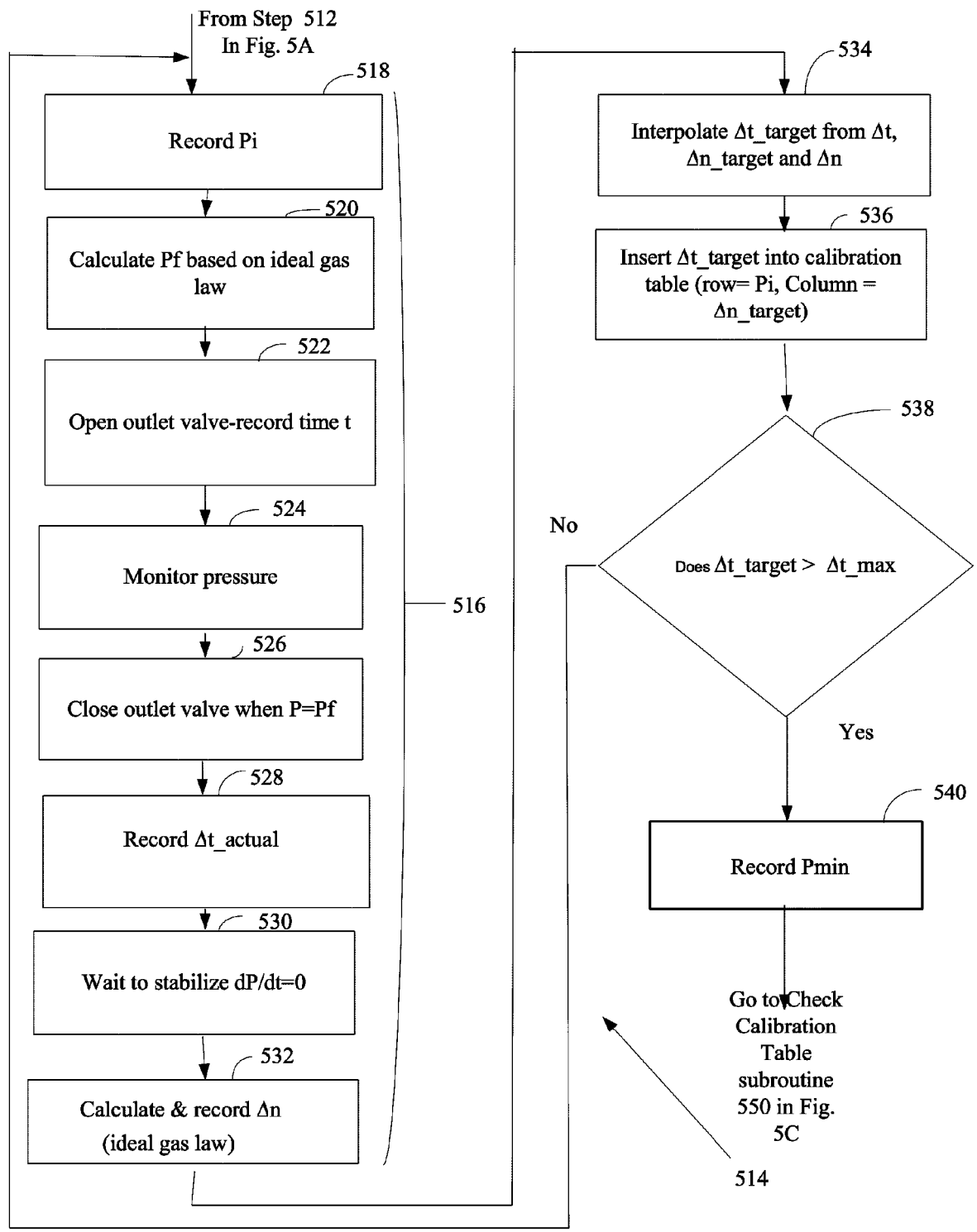
Figure 5C:
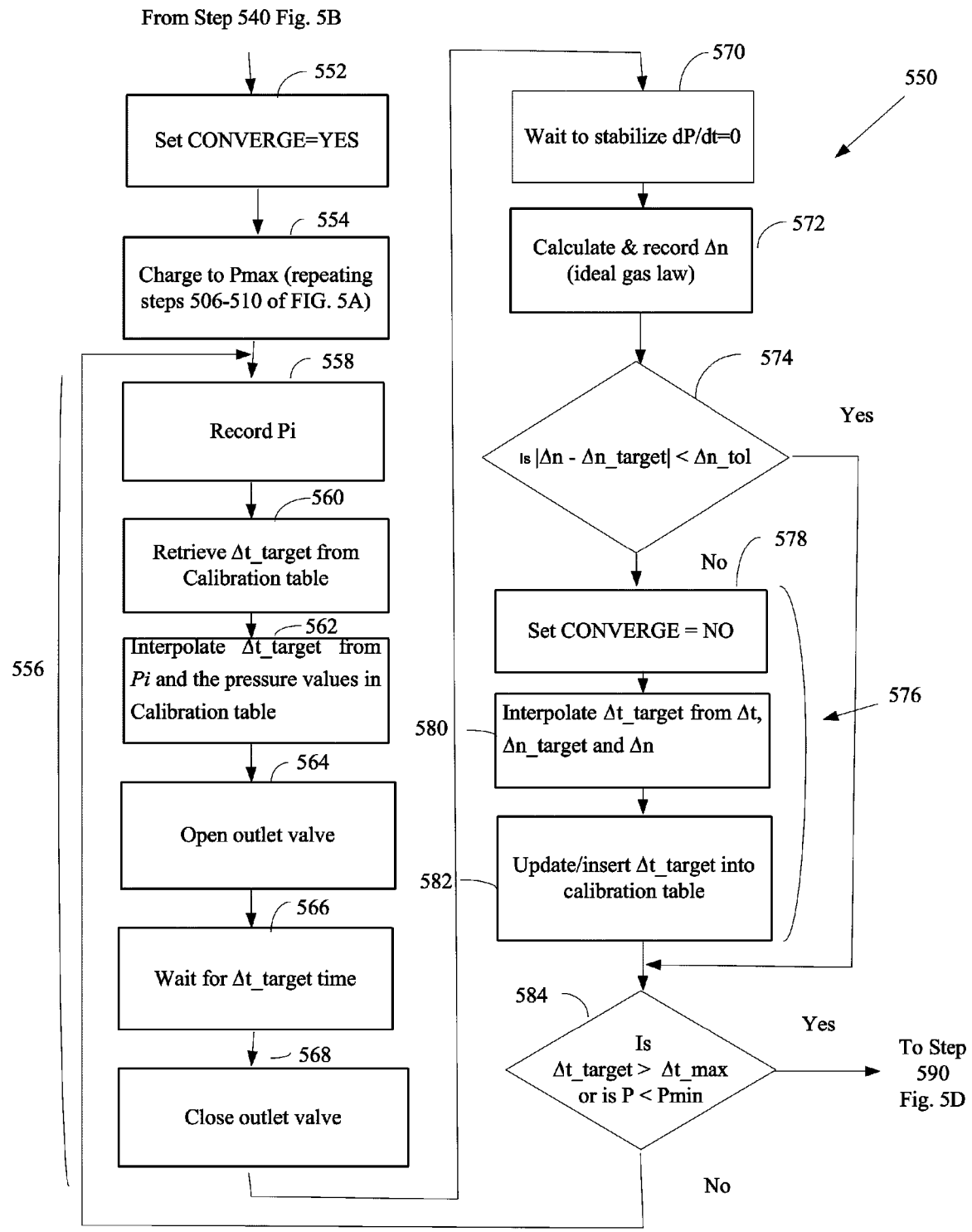
Figure 5D:
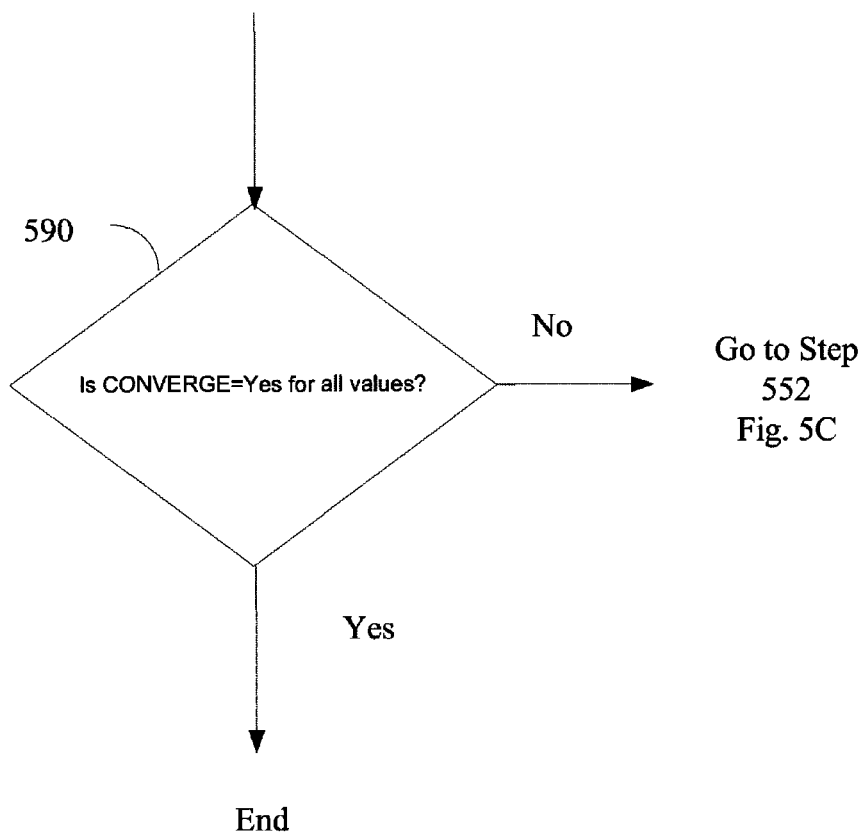

Referring to the drawings, FIG. 1 illustrates an exemplary embodiment of a pulsed gas delivery system or mole delivery device (MDD) 100; FIG. 2 illustrates an exemplary embodiment of a method 200 of calibrating the device 100, while FIG. 3 illustrates a state diagram of an exemplary embodiment of a method 300 of controlling the time interval of each pulse of gas as a function of the desired dose level and the initial or starting pressure of the gas or vapor in the chamber of device 100 at the start of delivery of each pulse. The system 100 and methods 200 and 300 are particularly intended for rapidly delivering very small, precisely metered quantities of process gases to a semiconductor process tool. In addition, the system and method provide highly repeatable performance results by delivering precise quantities of each gas used in semiconductor manufacturing processes by controlling the time duration of each delivered pulse of gas solely as a function of the dose level and the starting pressure within a delivery system independent of the gas being delivered. The gas is maintained at a constant uniform temperature determined as a function of the gas or vapor being delivered. The beginning pressure is measured prior to the delivery of the pulse so as to determine the time interval of the pulse based on previously determined correlated data. In one embodiment the ending pressure following the delivery of a pulse can be measured after the pressure has stabilized to insure the accuracy of the quantity of gas delivered. The temperature of the gas can be monitored, and in an alternative embodiment controlled so as to maintain it at a desired and constant level. The system and methods are particularly useful with systems requiring the delivery of very small doses, such as atomic layer deposition (ALD) systems and processes, making the systems and processes more efficient.

By keeping the temperature at a desired and constant level and using a chamber of known volume, the time duration is solely made dependent on only two variables, i.e., the desired dose level to be delivered and the initial pressure of the gas or vapor in the chamber of the system prior to delivery of the pulse. Consequently, a lookup can be established so as to provide the time duration of each pulse based upon the molar quantity of the dose to be delivered and the measured pressure within the upstream chamber at the start of the delivery of a pulse. As described above, under the conditions that the temperature remains constant and the volume of the chamber remains fixed, the ideal gas law indicates that the final pressure within the chamber following the delivery of each pulse is entirely predictable, given the beginning pressure and the time duration of the pulse. As a consequence the final pressure following the delivery of a pulse can be measured in order to determine whether the control valve is operating properly, but need not be measured as a part of determining the time duration of the pulse once the lookup table has been established.

As described in greater detail below with respect to FIG. 2, the system embodiment of FIG. 1 requires the collection of data for a lookup table representing the time durations of pulses that the system can provide so as to deliver precise molar quantities of gas or vapor in the chamber, given the measured starting pressure within the chamber prior to the delivery of a pulse. The range of data that can be reasonably used to operate the system requires consideration of the specifications of the gas or vapor to be delivered to the tool. The specifications include the range of temperatures and pressures that are acceptable to maintain the delivered material in a gas or vapor state. For many applications a particular temperature is preferred so that the material to be delivered is kept in the gas or vapor state. Using the ideal gas law, the number of moles delivered during a pulse is therefore a function of the initial pressure at the commencement of the pulse and the time interval of that pulse. Upon completion of the pulse, the pressure within the chamber is entirely predictable, and therefore need not be measured in order to control the operation of the valve. This provides an advantage since the pressure and temperature tend to fluctuate due to the flow of the gas within the chamber during the time interval the gas pulse is being delivered, making it very difficult to precisely control the operation of the valve. Each measurement of the initial or starting pressure of the gas or vapor within the chamber is taken after each pressure value has had a chance to stabilize so that the temperature of the gas or vapor remains at the fixed temperature value. The result is that the user or the system can request the desired amount or molar quantity of gas that is required with each pulse, and the system will deliver that amount by controlling the time duration of the pulse.

Described in greater detail, the system 100 shown in FIG. 1 comprises a delivery chamber 102 of a predetermined volume, a first or inlet valve 104 controlling gas flow into the chamber 102, and a second or outlet valve 106 controlling gas flow out of the chamber 102. In this implementation the chamber is configured so that the volume of the delivery chamber is known, and the chamber is maintained at a uniform and constant temperature before and after the delivery of a pulse. Further, the first and the second valves 104, 106 preferably comprise on/off, shut-off type valves, and at least the second or outlet valve 106 has a relatively very fast response time, e.g., between about 1 to 5 milliseconds, although the actual response time can vary depending on the application.

The illustrated pulsed gas delivery system 100 also includes a pressure transducer 108 for providing measurements of pressure within the chamber 102 and a temperature sensor 110 for providing measurements of temperature of the wall of the chamber 102. The pressure transducer 108 also preferably has a relatively very fast response time, e.g., of about 1 to 5 milliseconds, although the actual response time of the pressure transducer can also vary depending on the application.

An example of a suitable pressure transducer 108 for use with the delivery system 100 of the present disclosure is the Baratron® brand pressure transducers available from the assignee of the present application, MKS Instruments of Andover, Mass. (www.mksinst.com). Other pressure sensors having fast response times can also be used.

An input data device 114 of the illustrated pulsed gas delivery system 100 receives an input 112 either directly from a human operator or indirectly through a controller of the tool, e.g., a wafer processing computer controller. The input 112 represents the desired molar quantity of gas required by the tool, and passes instructions to a computer controller or processor (i.e., computer processing unit or "CPU") 116 to established the time duration required to deliver the desired molar quantity of gas with each pulse as a function of the initial pressure measured in the chamber 102 at the preferred temperature level within a range of initial pressures dependent on the gas or vapor to be delivered. The computer controller or processor 116 is connected to the pressure transducer 108, the temperature sensor 110, the valves 104, 106, a lookup table 118, and the input interface 114. Further, a heater 120 controlled, for example by the controller 116, can be provided to maintain the gas within the chamber 102 at the preferred temperature level when the pressure within the chamber is stable.

It is preferred that the temperature measurement be of the gas in the chamber, but the temperature throughout the chamber can vary making the measurement of the gas difficult if not impossible. Accordingly, the temperature of the wall is taken as the best estimate of the temperature of the gas or vapor. The measured wall temperature will equal the gas temperature so long as the pressure of the gas within the chamber remains stable. Further the entire volume needs to be a controlled and at a uniform temperature, avoiding temperature gradients as much as possible. Because the calibration data is a function of the ideal gas law, and that many precursors only exist as a gas at high temperatures, it is important that the gas be maintained at a temperate that is used to provide the calibration data. Further, the gas can vary in temperature when the pressure of the gas or vapor is changing due to a transition event, for example when the inlet valve is open to allow gas to flow into the chamber, or the outlet valve is open to allow gas to flow out of the chamber. For this reason it is important that the pressure of the gas be allow to stabilize following a transition event. If the volume changes the temperature to a different temperature from the one used in the calibration process, or a different operating temperature is desired, the lookup table needs to be repopulated. The input data interface 114 can also be used to input other processing instructions, such as the number and order of pulses of the various gases required to be delivered so as to provide a corresponding desired molar quantity of gas with each pulse over the course of the process. In some embodiments, the data interface 114 may also include an output interface constructed and arranged so as to provide an indication (either directly from a human operator or indirectly through a computer controller of a process tool such as a wafer processor) of the quantity of gas delivered by the system 100.

The input/output data interface 114 may be separated into separate units or combined into a single unit. The input/output interface 114 may connect to a personal computer with a keyboard and/or monitor.

According to one exemplary embodiment of the disclosure, the controller 116 of the pulsed gas delivery system 100 of FIG. 1 can be used to carry out the calibration and dose delivery methods 200 and 300 of FIGS. 2 and 3, respectively.

As illustrated in FIG. 2, the calibration process is used to create a look up table, such as the one illustrated in FIG. 4 at 400. The lookup table 400 can be stored in suitable memory as a part of the controller 116. In one embodiment (as illustrated in FIG. 4, described in more detail hereinafter), the data generated for the lookup table are a set of time intervals necessary to deliver a corresponding set of numbers of moles of a gas or vapor that are each delivered as a function of an initial pressure of the gas ($P_i$) in chamber 102 within a range of pressures that is predetermined Initially, as a part of the calibration process certain specifications of the gas or vapor to be delivered is provided to the system in order to generate the calibration table. The specifications include the expected range of doses (preferably in moles) that are required to be delivered to the process tool, the operating temperature of the gas or vapor (usually this will remain uniform throughout the process), and the maximum pressure ($P_{max}$) above which the gas or vapor becomes unsuitable for the process. There is also a minimum pressure ($P_{min}$) which is determined by the maximum allowable length of time the outlet valve can be opened. This minimum pressure is operator defined, and usually is dependent on the particular process being performed. The maximum and minimum pressures will define the range of the initial pressures for the lookup table being created. As will be more evident hereinafter, the initial pressure of the gas or vapor in chamber 102 (as measured by pressure transducer 108) is always allowed to stabilize before a pulse is delivered. The duration or interval of the pulse for delivering a precise molar quantity of gas will be dependent on the starting and ending pressure of the gas or vapor in the chamber. Specifically, using the ideal gas law, the dose amount is calculated as:

$$\Delta n = \frac{(P_i - P_f)V}{RT} \quad (1)$$

wherein:
$\Delta n$=the dose amount;
$P_f$=the final pressure;
$P_i$=the initial pressure;
V=the volume;
R=the universal gas constant; and
T=the volume temperature.
Equation (1) becomes $$n = K(Pi - Pf) \quad (2)$$

wherein K is a constant.

Thus, the number of moles is a function of the initial pressure and the final pressure. However as described above, under the conditions that the temperature remains constant and the volume of the chamber remains fixed, the ideal gas law indicates that the final pressure within the chamber following the delivery of each pulse is entirely predictable, given the beginning pressure and the time duration of the pulse. As a consequence, by generating a lookup table with suitable data, the final pressure following the delivery of a pulse need not be measured as a part of determining the time duration of the pulse. With only two variables, a lookup table can therefore be generated based upon knowledge of the acceptable range of pressures, Pmin to Pmax and maintaining the gas or vapor at a uniform temperature within the chamber 102.

Referring to FIG. 2, one embodiment of the calibration process 200 starts at 202. At step 204 data is received at step 204 representing certain specifications of the gas to be introduced into the chamber 102 for deliver to the tool. These specifications of the gas or vapor include the expected dose amounts for a particular process, the operating temperature and the maximum pressure (Pmax). At step 206, a determination is made whether the system 100 needs to be further calibrated. If yes, the data, the time duration values (t) are determined at step 208 as a function of the starting pressure and dose amount. This data can be generated in situ and need not be determined in the factory. As a result the system can be calibrated prior to a process being run. If at step 206, the lookup table is already sufficiently populated with the necessary data for the specifications provided at step 204, or if the additional data is generated for the lookup table at step 208 is completed, the system then proceeds at step 210 to the state machine for carrying out the process, such as the embodiment shown and described with reference to FIG. 3 below.

The temperature of the chamber 102 is continually monitored by sensing the output of the temperature transducer 110 and controlling the operation of the heater 120 in order to maintain the temperature within the chamber constant at the assigned value initially provided as a part of the specifications.

Referring to FIG. 3, in operation the system receives a command to provide a selected number of moles of gas within the chamber 102 to a tool. The state machine will then operate in the charge state 302. Accordingly, the outlet valve is closed and the inlet valve is opened to allow the pressure in the chamber to rise to an appropriate level within the range defined by the initial specifications. The inlet valve is then closed and the pressure is allowed to stabilized at state 304. As gas flows into or out of the chamber the temperature of the gas or vapor will fluctuate from its uniform value. Accordingly, allowing the pressure of the gas or vapor to stabilize at the initial or beginning pressure (Pi) level before proceeding the next state allows the temperature of the gas or vapor to return to its uniform temperature. This insures accurate delivery of the correct dose.

The system then proceeds to state 306. The pressure Pi is measured with pressure transducer 108 and the value of $\Delta t$ that is retrieved from the lookup table as a function of the requested number of moles of gas or vapor to be delivered. The state machine 300 will then transition to state 308, wherein the system waits for the command to deliver the requested dose. Transitioning to state 310, the outlet valve 108 is opened for the time $\Delta t$ provided from the lookup table. For example, referring to FIG. 4, if Pi corresponds to P3, and the number of moles required is n2, the lookup table shows that the outlet valve 108 needs to be open for a duration of $\Delta t = t32$.

Accordingly, referring again to FIG. 3, at state 310, the valve is opened for the $\Delta t$ indicated in the lookup table, whereupon the outlet valve 108 is closed when $\Delta t = t32$. The system then transitions to state 312 to allow the pressure within chamber 102 to stabilize and the temperature to settle at the desired operating temperature. This can be confirm by reading the pressure and temperature transducers 108 and 110. Transitioning to state 314, the system determines the current pressure (final pressure Pf), and the number of moles (N) are calculated. The system can then proceed to cycle through states 302 to 314 to deliver the next prescribed dose.

In an alternative embodiment, following state 314 in FIG. 3, the system can transition to state 316 to confirm that a correct dose has been delivered, and to update the lookup table if required. This allows for in situ calibration.

In another alternative embodiment, it is possible to proceed from state 314 to 318 to determine whether the final pressure Pf is less than the Pmin defined by the original specifications. If not, rapid dosing can be achieved by skipping states 302 and 304 in the next cycle by proceeding to state 306. If Pf is less than Pmin, the chamber 102 will need to be charged at state 302 by opening the inlet valve (with the outlet valve remaining closed) so as to allow more gas or vapor into the chamber. The process can then proceed to step 304, etc.

As stated above, when generating the data for the lookup table, the permissible pressure range can be provided as a part of the specifications provided during the calibration steps in FIG. 2. System 100 can not deliver more moles than the chamber contains at the beginning of a pulse. Also the downstream conditions (pressure temperature and volume of the chamber) will vary from tool to tool and determine how fast the flow can leave the chamber 102. As a practical matter, for a target dosage and the minimum pressure will be limited when the corresponding $\Delta t$ for the initial pressure Pi becomes too burdensome for the process. A typical example of the maximum $\Delta t$ is anything over 2 seconds, but clearly this will vary depending on the applications and circumstances.

Referring to FIG. 5, the following is one embodiment for populating the lookup table with the required data. Referring to FIG. 5A, the calibration process 500 begins at step 502 with the system receiving information regarding the process that is to be performed using the system. In the example given the information includes Pmax, $\Delta t\_max$ and $\Delta n\_target$ (target dosage) as well as reservoir volume and temperature and a convergence tolerance $\Delta n\_tol$. As will be more evident hereinafter, $\Delta n\_tol$ represents the difference that can be tolerated between the actual mole value corresponding to a particular starting pressure of the gas within the reservoir, and the value determined using the ideal gas law.

Once the information is received, the calibration process proceeds to subroutine 504 for charging the reservoir to the maximum pressure Pmax determined in step 502. Subroutine 504 includes opening the inlet valve at step 506, monitoring the pressure at step 508, closing the inlet valve when P=Pmax at step 510 and waiting for P to stabilize dP/dt=0 at step 512. The system then proceeds to initialize the calibration table using a subroutine 514 illustrated in FIG. 5B.

Subroutine 514 includes subroutine 516 for determining each dose valve Δn. Subroutine 516 includes the following with respect to each measurement made. First the value of the beginning or initial pressure Pi is recorded in the table. The final pressure Pf is then calculated at step 520 given the value of Δn and Pi using the ideal gas law (using equation 2). Once determined, the outlet valve is then opened at step 522, and the pressure in the reservoir is monitored at step 524. When the monitor pressure equals the predetermined value of Pf (P=Pf) the outlet valve is closed at step 526. The actual value of the time interval, Δt_actual, is then recorded at step 528. The system then waits at step 530 for the pressure in the reservoir to stabilize (dP/dt=0). Once stabilized the process proceeds to step 532. With the actual measured values of Pi and Pf, the value of Δn is then calculated in accordance with the ideal gas law.

At step 534, the system then interpolates the value of the Δt_target from the measured value of Δt, and Δn_target and the calculated value of Δn. It should be appreciated that at this step, one can implement PID control on the valve timing for in situ calibration. At step 536 the resulting values of Δt_target is inserted into calibration table (at row=Pi, Column=Δn_target). At step 538, the system then checks to determine whether Δt_target>Δt_max. If no the process then returns to step 518 and steps 518-536 are repeated. If yes, the value of Pmin is then recorded at step 540, and the process proceeds to step 552 of a routine 550 to check to calibration table.

Subroutine 550 includes a first step 552, wherein the system sets CONVERGE=YES, indicating initially that the values of the measured and calculated are within tolerable limits. At step 554 the reservoir is next charged to Pmax (repeating subroutine 504 including steps 506-510). The process then proceeds through the dose measurement routine 556 as a function of the time interval Δt. During routine, the system records the beginning pressure Pi at step 558. The value of Δt_target is retrieved from the calibration table at step 560. The value of Δt_target is then interpolated at step 562 from the value of Pi and the pressure values in the calibration table. At step 564, the outlet valve is open, and the system waits at step 566 for the values of the time Δt_target. Once the values are provided, the system closes the outlet valve 568. The subroutine 550 then proceeds to step 570, wherein the system waits for the pressure in the reservoir to stabilize dP/dt=0. At step 572, the value of Δn is then calculated and recorded using the ideal gas law. At step 574, the inquiry is made whether convergence has been achieved, i.e., whether the absolute value |Δn−Δn_target|<Δn_tol (the value provided at step 502 at the beginning of the process. If yes, the system proceeds to step 584 described below. If no, convergence has not been achieved, and the system runs subroutine 576 starting with step 578 by setting CONVERGE=NO. At step 580, the value of Δt_target is interpolated from the measured value of Δt, and Δn_target from the measured Δn. The system then updates or inserts the value of Δt_target into the calibration table at step 582. The system then proceeds to step 584.

At step 584 the system then checks to determine whether the value of Δt_target>Δt_max, or P<Pmin. If no, the process returns and repeats steps 558-574 (and steps 578-582, if necessary). If yes, the process proceeds to step 590 shown in FIG. 5D, where it is determined whether CONVERGE=YES has been set of for all values of interest, i.e., every value in the table has converged. If yes, the population of the calibration table has been completed with data. If no, the system returns to step 552 (FIG. 5C), and steps 552-574 (steps 578-582 if necessary), and steps 584 are repeated.

It should be appreciated at a PID or other standard algorithm can be applied here to carry out the convergence subroutines. The method just described represents a second embodiment of FIG. 3, wherein the system is operating continuously in calibration mode with the exception that the customer triggers the dose process.

The pressure range, pressure step size, time range, and time step size can be pre-programmed or user defined and can be provided through the input data interface 116. A pressure range can comprise, for example, 1-20 Torr with a step size of 0.5 Torr. A time range can comprise, for example, 0.1-1.5 seconds with a step size of 0.1 seconds, although the time range and step size can clearly vary depending in part on the application.

It should be appreciated that the lookup table calibration routine described and illustrated in FIGS. 5A-5D is one exemplary embodiment of the presently disclosed pulsed gas delivery system 100. Any process that can populate a portion or all of the lookup table 112 is within the scope of the present disclosure. For example, the pressure and time can both be changed during iterations of the calibration loop. Since the pressure is lowered with each discharge and it takes time to recharge the chamber 102, the controller 114 may continuously test various time intervals until the pressure falls outside the range. The lookup table may be stored in any data structure, sorted or unsorted.

Figure 6:
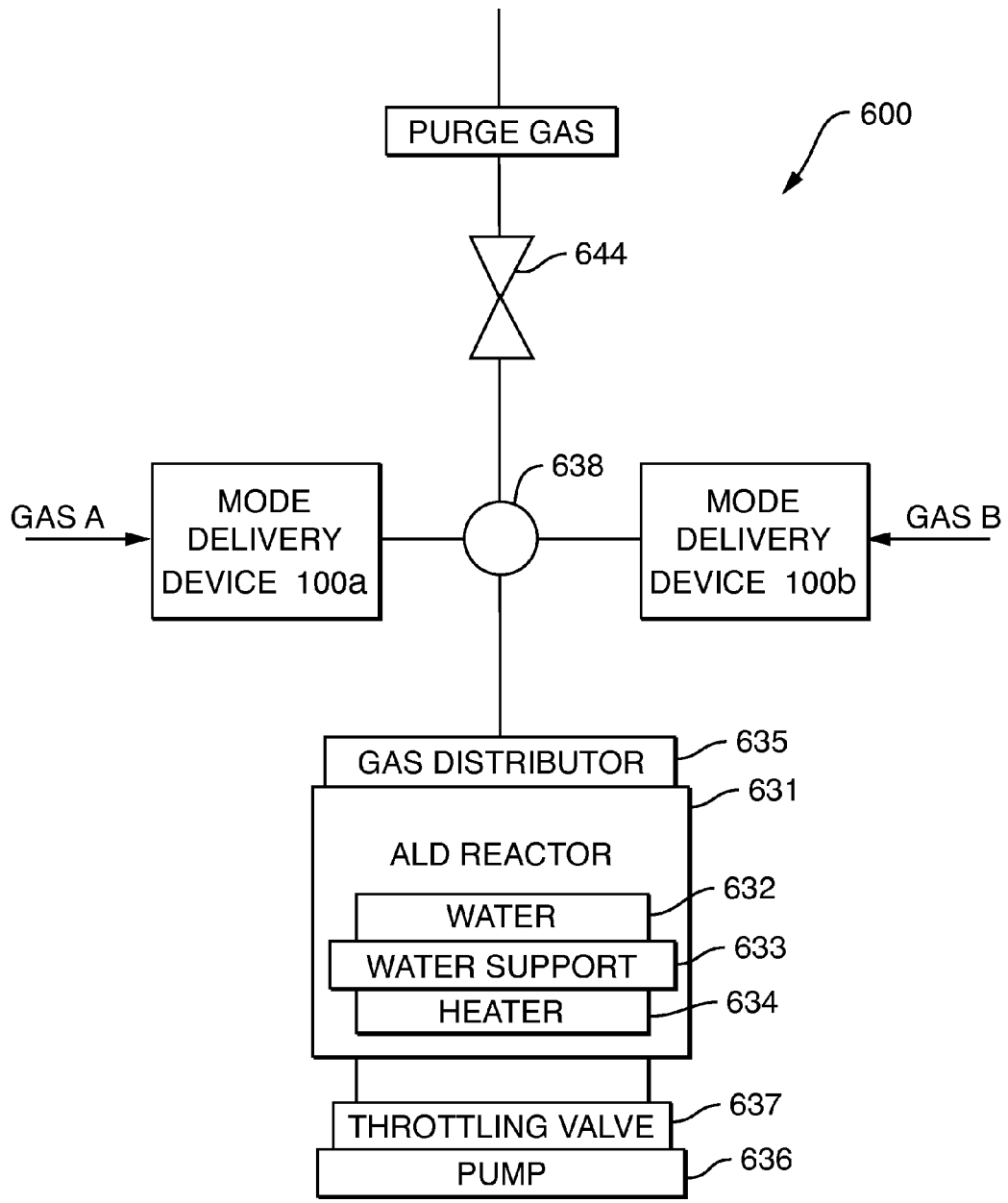
FIG. 6 is a schematic illustration of an exemplary embodiment of an atomic layer deposition system including two of the pulsed gas delivery systems of FIG. 1.

FIG. 6 is a schematic illustration of an exemplary embodiment of an atomic layer deposition system 600. The system 600 includes a processing tool in the form of ALD reactor 631 for housing a semiconductor wafer or substrate 632. Typically, the wafer 632 resides atop a support (or chuck) 633 and a heater 634 is coupled to the chuck to heat the chuck 633 and the wafer 632 for film deposition. The processing gases are introduced into the chamber 631 through a gas distributor 635 located at one end of the chamber 631. A vacuum pump 636 is located at the opposite end to draw gas flow across the wafer surface. A throttling valve 637 may be provided to regulate the pressure within the process chamber.

A variety of chemical vapor deposition (CVD) techniques for combining vapors and gases can be utilized, including adapting techniques known in the art. Although not shown, the gases may also be introduced as plasma. The gas distributor 635 receives gas from one or more mole delivery devices (MDDs) 100, such as MDD 100a and 100b shown in FIG. 6. The system 600 also includes a multi-way connector 638 for directing the various processing gases and purge gases into the gas distributor 635 and into the processing chamber 631.

The illustrated multi-way connector 638 has two inlets for the introduction of gases and chemicals, and an inlet for introduction of a purge gas. In other embodiments, the multi-way connector 538 may have a different number of inlets connecting a different number of gas sources. The purge gas is typically an inert gas, such as nitrogen. In this example, gas A and gas B are shown combined with the purge gas. Gas A may pertain to a first precursor gas and gas B may pertain to a second precursor gas for performing atomic layer deposition on the semiconductor wafer 632 contained in the process chamber 631. Chemical selection manifolds (not shown) provide for the selecting of chemicals that can be used as precursor gases A and B. Outlet valves 102 (not shown in FIG. 6 of each MDD 100 respectively regulate the introduction of the precursor gases A and B into the multi-way connector 638, while control type valve 644 regulates the flow of purge gas.

Once the wafer 632 is resident within the processing chamber 631, the chamber environment is brought up to meet desired parameters. For example, the temperature of the semiconductor wafer 632 is increased in order to perform atomic layer deposition. When atomic layer deposition is to be performed, the outlet valve of MDD 100b is opened to allow the first precursor to be introduced into the process chamber 631. After a preselected period of time, the outlet valve of MDD 100b is closed, valve 644 is opened, and the purge gas purges any remaining reactive species from the process chamber 631. Then, after another preselected time, the valve 644 is closed to stop the purge gas, and the outlet valve of MDD 100a is opened to introduce the second precursor into the process chamber 631. Again after another preselected time, the outlet valve of MDD 100a is closed, the valve 644 is opened, and the purge gas purges the reactive species from the process chamber 631. The two chemicals A and B are alternately introduced into the carrier flow stream to perform the atomic layer deposition cycle to deposit a film layer on the semiconductor wafer 632.

Thus, the pulses of precursor gases into the processing chamber 631 are controlled using the respective outlet valves 102 of the MDDs 100a and 100b, which are simply opened for a predetermined period of time to deliver a desired amount of precursor gas into the processing chamber 631. Each of the mole delivery devices can be calibrated and used as previously described in connection with FIGS. 1-5.

One skilled in the art will appreciate that embodiments of the present disclosure, including control algorithms/software/signals for controlling electrolysis, can be implemented in hardware, software, firmware, or any combinations of such, and over one or more networks.

Having described embodiments of the invention in detail, various modification and improvements will readily occur to those skilled in the art. Such modification and improvements are intended to be within the scope of the invention. Accordingly, the foregoing description is by way of example only, and is not intended as limiting. The invention is limited only as defined by the following claims and the equivalents thereto. Accordingly, the embodiments described herein, and as claimed in the attached claims, are to be considered in all respects as illustrative of the present disclosure and not restrictive.

What is claimed is:

1. A pulse gas delivery system configured to deliver a range of precise and repeatable doses of a gas, comprising:
   a chamber of known volume and constructed and arranged to maintain the gas within the chamber at a uniform temperature and stabilized pressure within a range of pressures respectively before and after each dose of gas is delivered from the chamber;
   a valve constructed and arranged to open and close during a controlled time interval so as to deliver a pulse of gas of a requested dose during the time interval;
   a lookup table including data representing various time intervals, each time interval being a function of a corresponding dose of the gas to be delivered from the chamber and the initial stabilized pressure within the chamber; and
   a controller configured to access the lookup table, wherein the controller is operative to control the time interval of the valve solely as a function of the desired dose level of gas, and the initial stabilized pressure of the gas in the chamber before the delivery of each pulse.

2. A pulse gas delivery system according to claim 1, wherein the table is populated with data generated in situ.

3. A pulse delivery system according to claim 1, wherein the time interval corresponding to a dose and initial pressure is determined by measuring the time it takes for the gas in the chamber to transition from the initial pressure when the valve is opened to the final pressure when the valve is closed all in accordance with the following relationship:

$$n=k(Pi-Pf),$$

wherein n is the dose in moles,
k is a constant,
Pi is the initial stabilized pressure within the chamber,
Pf is the final stabilized pressure within the chamber.

4. A pulse delivery system according to claim 3, further including a pressure measurement subsystem constructed and arranged so as to measure the initial and final stabilized pressures of the gas in the chamber, wherein the value of each time interval is determined for each value of n and Pi, by measuring the pressure within the chamber during the time duration the valve is open to determine when the pressure within the chamber is equal to Pf.

5. A pulse gas delivery system according to claim 3, wherein the pressure measurement subsystem is constructed and arranged to measure each of the initial and final pressures of the gas in the chamber when the pressure in the chamber is stable before and after respectively the opening and closing of the valve.

6. A pulse gas delivery system according to claim 1, the further including a temperature control subsystem for maintaining the gas in the chamber at the uniform temperature.

7. A pulse gas delivery system according to claim 6, wherein the temperature control subsystem includes a heater constructed and arranged so as to heat the gas in the chamber so as to maintain the gas at the uniform temperature.

8. A pulse gas delivery system according to claim 6, wherein the controller includes a pressure measurement subsystem for measuring the initial and final pressures of the gas in the chamber before and after the valve is opened and closed and the pressure has stabilized, wherein data is generated based on the size of the dose requested and the initial pressure that is measured, and the final pressure determined from the following relationship n =k(Pi-Pf), wherein n is the dose in moles, k is a constant, Pi is the initial pressure and Pf is the final pressure.

9. A pulse gas delivery system according to claim 8, wherein the final pressure is compared to the measured final pressure so as to confirm the proper operation of the valve.

10. A pulse gas delivery system according to claim 6, further including a pressure measurement subsystem constructed and arranged to measure the initial and final pressures of the gas in the chamber after they have stabilized respectively before and after the valve is opened.

11. A pulse gas delivery system according to claim 10, wherein the final pressure of the gas in the chamber is measured following the time duration of the pulse, to insure the accuracy of the valve.

12. A pulse gas delivery system according to claim 1, wherein the chamber is refilled with gas after each dose of gas is delivered from the chamber.

13. A pulse gas delivery system according to claim 1, wherein the chamber is refilled with gas after multiple doses of gas are delivered from the chamber.

14. A pulse gas delivery system according to claim 1, wherein the chamber is refilled with gas only when the pressure within the chamber falls below a preset level.

15. A pulse gas delivery system according to claim 1, further including a second valve constructed and arranged to open so as to fill the chamber with gas so long as the first mentioned valve is closed, and close so as to maintain the gas in the chamber so that one or more doses can be subsequently delivered from the chamber.

16. A pulse gas delivery system according to claim 15, wherein controller operates the second valve so as to fill the chamber when the pressure of the gas in the chamber falls below a preset level.

17. A system comprising:
   a tool constructed and arranged for carrying out a deposition process using precise amounts of gas to form deposition layers on a workpiece; and
   a mole delivery device comprising:
      a pulse gas delivery device configured to deliver a range of precise and repeatable doses of a gas to the tool;
      a chamber of fixed volume constructed and arranged to maintain the gas within the chamber at a uniform temperature and stabilized pressure within a range of pressures respectively before and after each dose of gas is delivered from the chamber;
      a valve constructed and arranged to open and close during a controlled time interval so as to deliver a pulse of gas of a requested dose during the time interval;
      a lookup table including data representing various time intervals, each time interval being a function of a corresponding dose of the gas to be delivered from the chamber and the initial stabilized pressure within the chamber; and
      a controller configured to access the lookup table, wherein the controller is operative to control the time interval of the valve solely as a function of the desired dose level of gas, and the initial stabilized pressure of the gas in the chamber before the delivery of each pulse.

18. The system according to claim 17, wherein the system is an atomic layer deposition system.

19. A system according to claim 18, further including at least two mole delivery devices, each configured to alternatively deliver pulses of metered amounts of two precursor gases.

20. A system according to claim 17, wherein the lookup table is populated with data generated in situ.

21. A system according to claim 17, wherein the time interval corresponding to a dose and initial pressure is determined by measuring the time it takes for the gas in the chamber to transition from the initial pressure when the valve is opened to the final pressure when the valve is closed all in accordance with the following relationship:

$$n = k(P_i - P_f),$$

wherein n is the dose in moles,
k is a constant,
$P_i$ is the initial stabilized pressure within the chamber,
$P_f$ is the final stabilized pressure within the chamber.

22. A system according to claim 17, wherein the chamber is refilled with gas after each dose of gas is delivered from the chamber.

23. A system according to claim 17, wherein the chamber is refilled with gas after multiple doses of gas are delivered from the chamber.

24. A pulse gas delivery system according to claim 17, wherein the chamber is refilled with gas only when the pressure within the chamber falls below a preset level.

25. A pulse gas delivery system according to claim 17, further including a second valve constructed and arranged to open so as to fill the chamber with gas so long as the first mentioned valve is closed, and close so as to maintain the gas in the chamber so that one or more doses can be subsequently delivered from the chamber.

26. A pulse gas delivery system according to claim 25, wherein controller operates the second valve so as to fill the chamber when the pressure of the gas in the chamber falls below a preset level.

* * * * *